United States Patent
Cruz-Uribe et al.

(10) Patent No.: US 9,028,051 B2
(45) Date of Patent: *May 12, 2015

(54) SHEAR MODE PHYSICAL DEFORMATION OF PIEZOELECTRIC MECHANISM

(75) Inventors: Tony S. Cruz-Uribe, Corvallis, OR (US); Peter Mardilovich, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/000,619

(22) PCT Filed: Apr. 5, 2011

(86) PCT No.: PCT/US2011/031276
§ 371 (c)(1),
(2), (4) Date: Aug. 21, 2013

(87) PCT Pub. No.: WO2012/138328
PCT Pub. Date: Oct. 11, 2012

(65) Prior Publication Data
US 2013/0335487 A1  Dec. 19, 2013

(51) Int. Cl.
*B41J 2/045* (2006.01)
*B41J 2/14* (2006.01)
*B41J 2/16* (2006.01)
(Continued)

(52) U.S. Cl.
CPC *B41J 2/045* (2013.01); *Y10T 29/42* (2015.01); *B41J 2/14233* (2013.01); *B41J 2/161* (2013.01); *B41J 2/1628* (2013.01); *B41J 2/1631* (2013.01); *B41J 2/1643* (2013.01); *B41J 2/1646* (2013.01); *B41J 2002/14491* (2013.01); *H01L 41/0973* (2013.01); *H01L 41/257* (2013.01);
(Continued)

(58) Field of Classification Search
None
See application file for complete search history.

(56) References Cited

U.S. PATENT DOCUMENTS

| | | | |
|---|---|---|---|
| 5,202,703 | A | 4/1993 | Hoisington et al. |
| 6,806,620 | B1 | 10/2004 | Wischnewskiy |

(Continued)

FOREIGN PATENT DOCUMENTS

| | | |
|---|---|---|
| JP | 09093078 | 4/1997 |
| JP | 11026832 | 1/1999 |

(Continued)

OTHER PUBLICATIONS

C. Majida et al., "Analysis and design principles for shear-mode piezoelectricity energy harvesting with ZnO nanoribbons," Smart Mater. Struct. 19 (2010) 055027.

(Continued)

*Primary Examiner* — Erica Lin
(74) *Attorney, Agent, or Firm* — Michael A. Dryja

(57) ABSTRACT

A piezoelectric mechanism includes first and second electrodes and a thin film sheet of piezoelectric material. The second electrode is interdigitated in relation to the first electrode. The first and the second electrodes are embedded within the thin film sheet. The thin film sheet is polarized in a direction at least substantially perpendicular to a surface of the thin film sheet. The thin film sheet is to physically deform in a shear mode due to polarization of the thin film sheet at least substantially perpendicular to the surface of the thin film sheet, responsive to an electric field induced within the thin film sheet at least substantially parallel to the sheet via application of a voltage across the first and the second electrodes.

12 Claims, 12 Drawing Sheets

(51) Int. Cl.
*H01L 41/09* (2006.01)
*H01L 41/29* (2013.01)
*H01L 41/047* (2006.01)
*H01L 41/31* (2013.01)
*H01L 41/257* (2013.01)

(52) U.S. Cl.
CPC ............ *H01L 41/29* (2013.01); *H01L 41/047* (2013.01); *H01L 41/31* (2013.01); *B41J 2202/18* (2013.01)

(56) References Cited

U.S. PATENT DOCUMENTS

| | | | |
|---|---|---|---|
| 6,863,383 | B2 | 3/2005 | Takahashi |
| 2007/0285473 | A1* | 12/2007 | Onozawa ........................ 347/75 |
| 2009/0115820 | A1* | 5/2009 | Nomura et al. ................. 347/68 |
| 2010/0045142 | A1 | 2/2010 | Pulskamp et al. |
| 2010/0073823 | A1 | 3/2010 | Aoki et al. |

FOREIGN PATENT DOCUMENTS

| | | |
|---|---|---|
| JP | 2001111132 | 4/2001 |
| JP | 2005150351 | 6/2005 |
| WO | WO 2007080734 A1 * | 7/2007 |

OTHER PUBLICATIONS

S-W Hsiao et al., "Single-Phase Drive Linear Ultrasonic Motor with Perpendicular Electrode Vibrator," Japanese Journal of Applied Physics 49 (2010) pp. 024201.

* cited by examiner

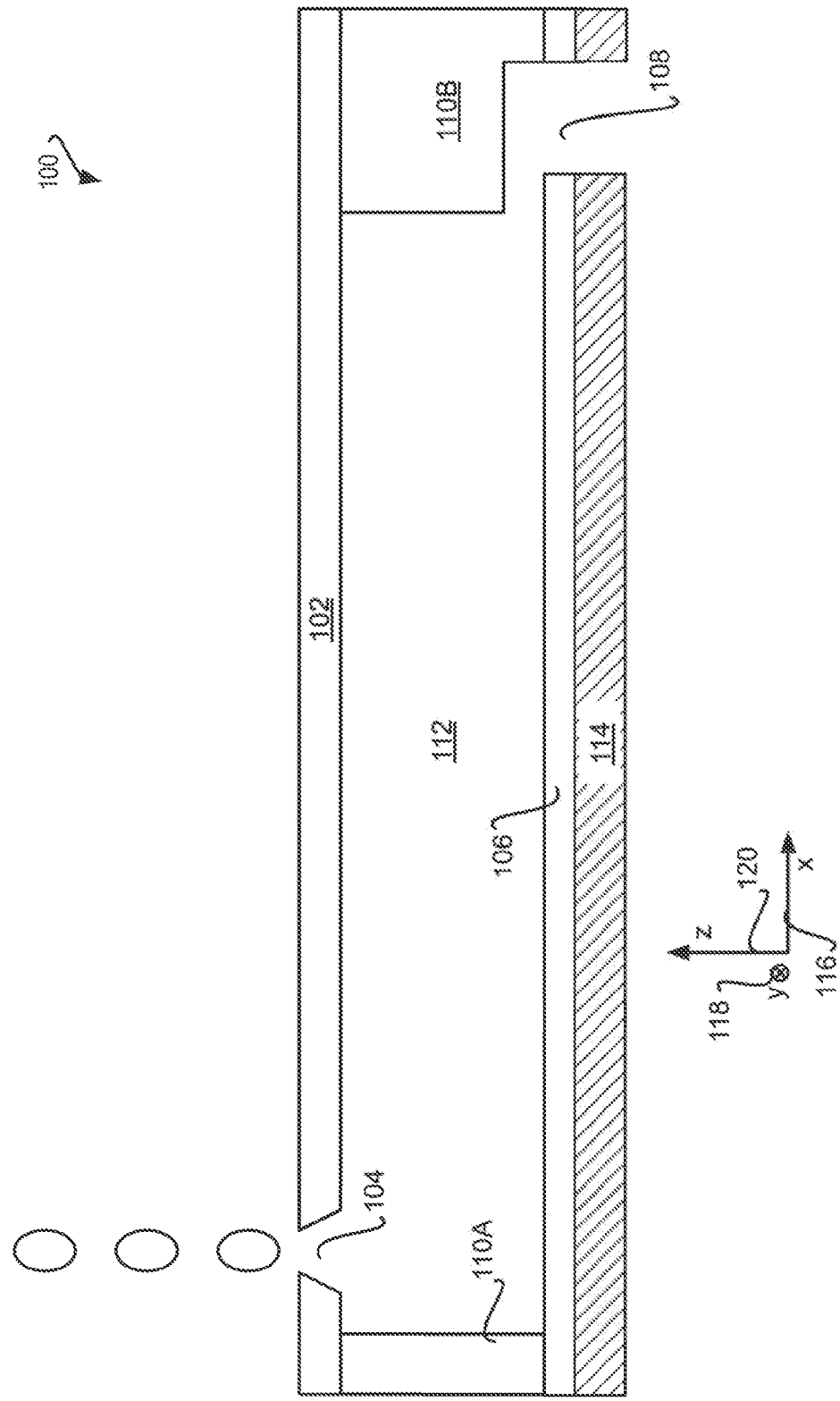

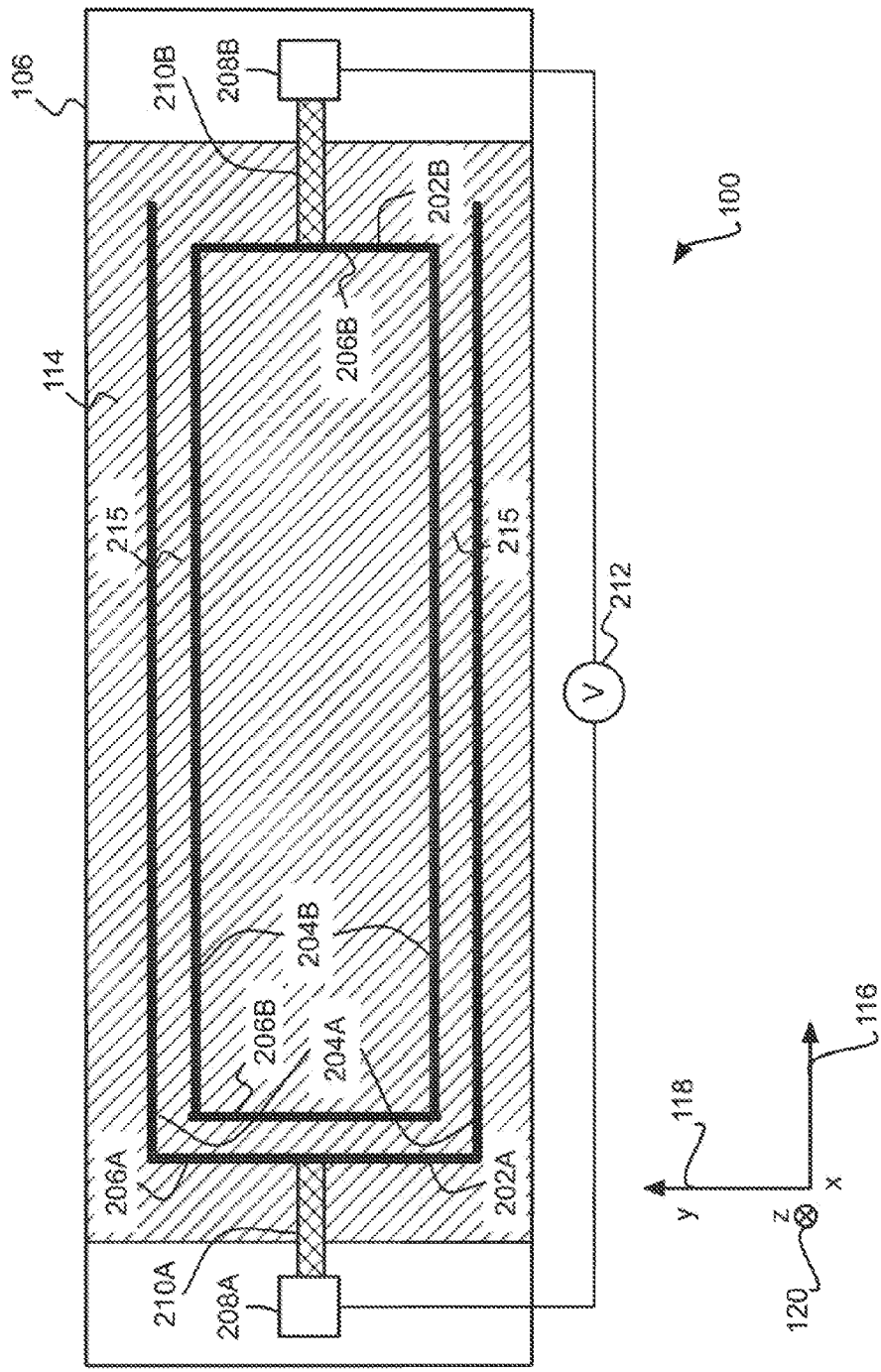

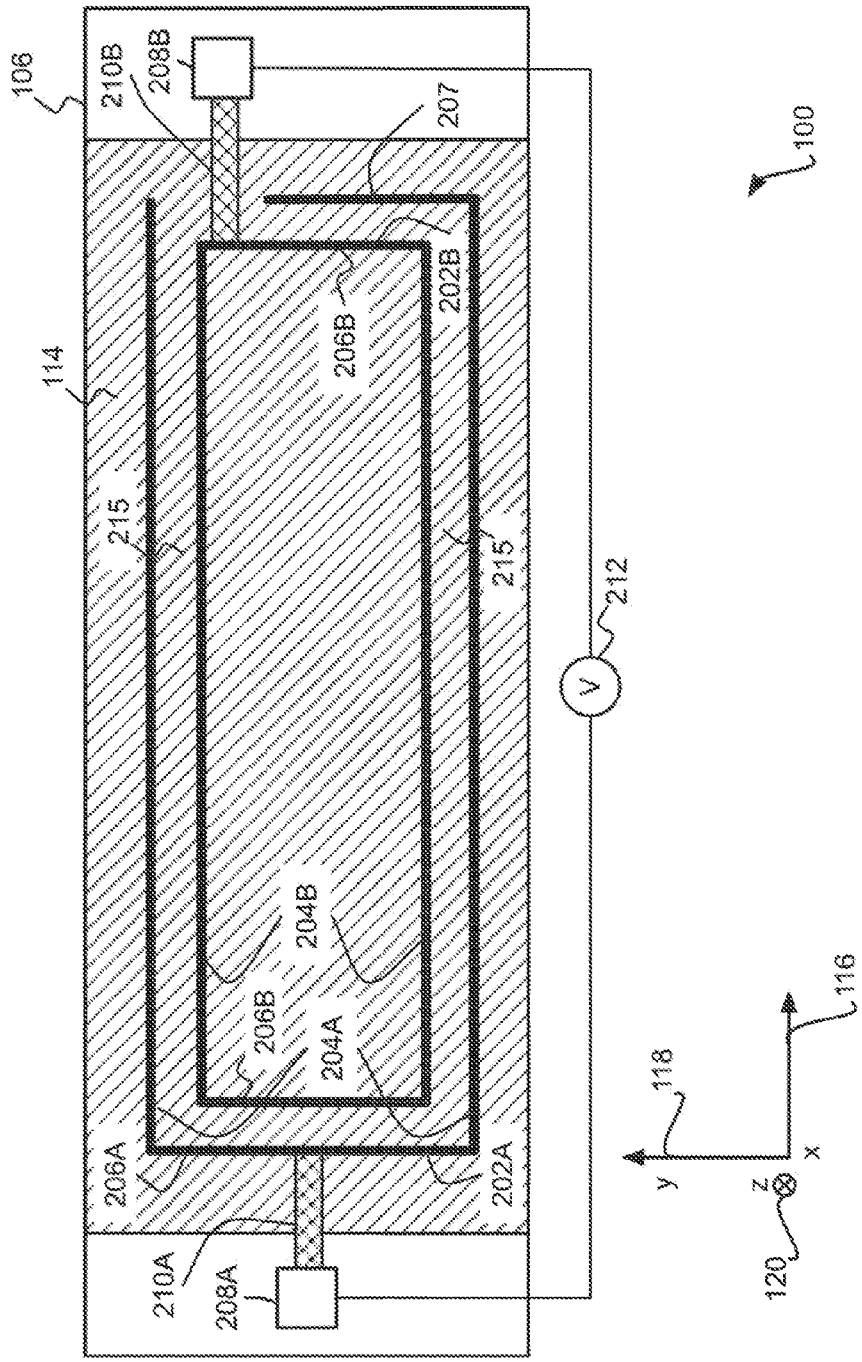

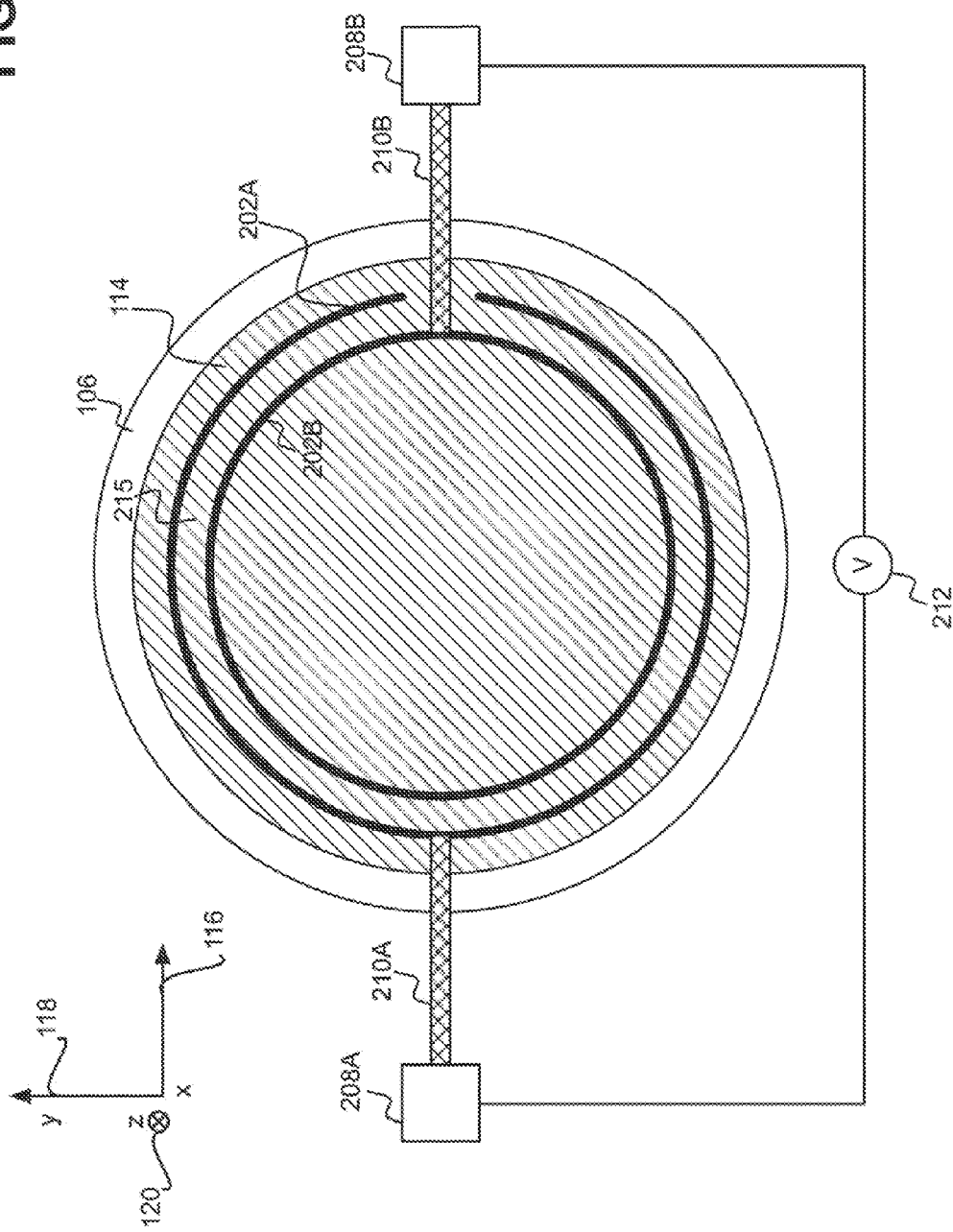

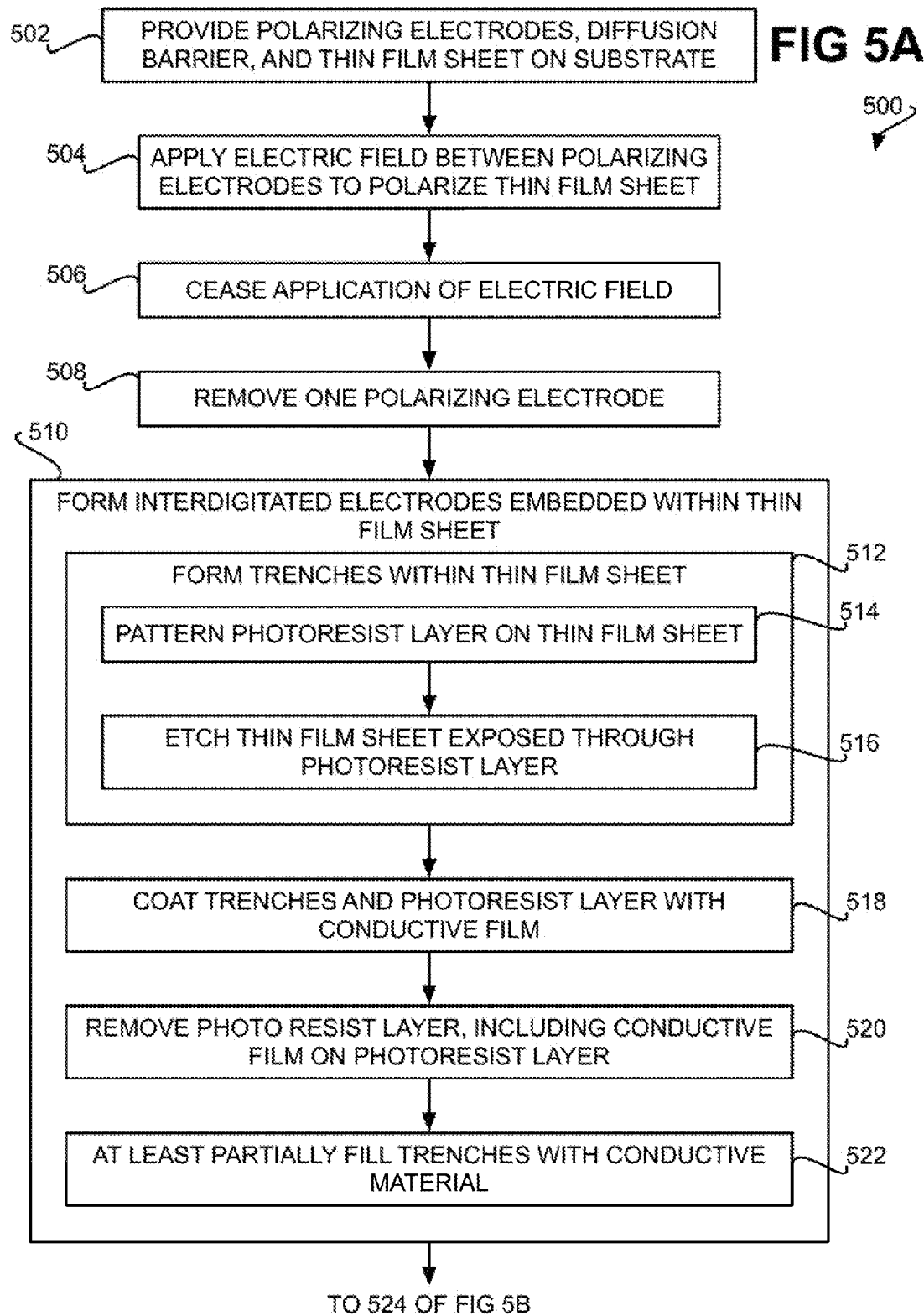

SHEAR MODE PHYSICAL DEFORMATION OF PIEZOELECTRIC MECHANISM

This application is a continuation of 371 National State PCT/US2011/031276, filed on Apr. 5, 2011.

BACKGROUND

Fluid-ejection devices are employed to eject droplets of fluid. For example, inkjet printing devices eject droplets of ink onto media like paper to form images on the media. One type of fluid-ejection device is a piezoelectric fluid-ejection device. In a piezoelectric fluid-ejection device, piezoelectricity is used to eject mechanically droplets of fluid. In particular, an electric field is induced within a flexible sheet of piezoelectric material to cause the sheet to physically deform. Physical defamation of the sheet reduces the volume of fluid in an adjacent chamber, resulting in one or more droplets of fluid being ejected.

BRIEF DESCRIPTION OF THE DRAWINGS

FIG. 1 is a cross-sectional side view diagram of an example piezoelectric fluid-ejection assembly.

FIGS. 2A, 2B, and 2C are bottom view diagrams of different example piezoelectric fluid-ejection assemblies.

FIGS. 5A and 5B are flowcharts of an example method for fabricating a piezoelectric actuator of a piezoelectric fluid-ejection assembly.

DETAILED DESCRIPTION OF THE DRAWINGS

Figure 3A:
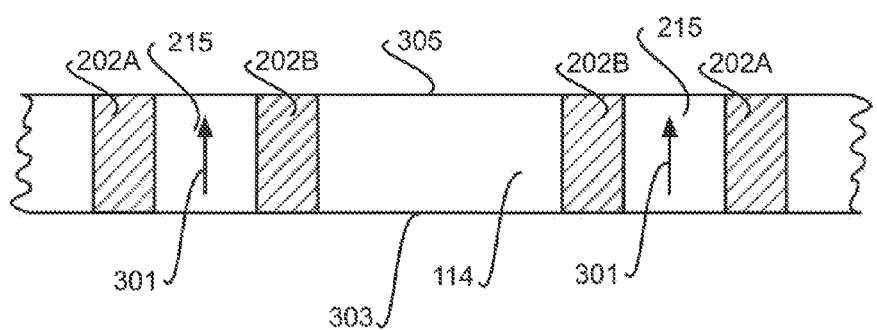
FIGS. 3A and 3B are cross-sectional front view diagrams of an example piezoelectric actuator of a piezoelectric fluid-ejection assembly, in a relaxed state and in an excited state, respectively.

As noted in the background, in a piezoelectric fluid-ejection device, an electric field is induced within a flexible sheet of piezoelectric material to cause the sheet to physically deform. The transfer of this mechanical response from a surface of the sheet to fluid within an adjacent chamber results in the fluid becoming displaced and pressurized, which causes one or more droplets of fluid being ejected. The electric field is induced within the sheet by applying a voltage across electrodes disposed on the flexible sheet.

A particularly efficient piezoelectric actuator is one that operates in shear mode. In shear mode, top and bottom portions of the piezoelectric actuator move in at least substantially opposite directions at least substantially parallel to the surface of the actuator, and responsive to an electric field induced within the piezoelectric actuator at least substantially perpendicular to the direction of internal polarization. The result of this shearing motion is the physical deformation of the piezoelectric actuator outwards from the plane of the actuator.

Existing piezoelectric actuators that operate in shear mode are not as efficient as they can be. Specifically, the pairs of electrodes that generate the electric field are interdigitated but formed on the surface of the piezoelectric actuator. When the electrodes generate the electric field, regions of the piezoelectric actuator adjacent to and underneath the electrodes physically deform less in desired directions than other regions of the electrode. Specifically, the electric field near the electrodes is not at least substantially parallel to the plane of the actuator. In addition, the electric field diminishes in the regions below the electrode at increasing distances from the electrode. As such, the piezoelectric actuator is not maximally utilized.

Disclosed herein are piezoelectric actuators that more efficiently operate in shear mode, as well as methods for manufacturing such actuators. A piezoelectric actuator, or mechanism, includes pairs of interdigitated electrodes embedded within a thin film sheet of piezoelectric material. The thin film sheet is polarized in a direction at least substantially perpendicular to the sheet's surface. The thin film sheet physically deforms in shear mode due to this polarization, responsive to an electric field induced within the thin film sheet via application of a voltage across the electrodes. Because the electrodes are embedded within the thin film sheet, the thin film sheet deforms more than if the electrodes were located on the surface of the sheet.

Such a piezoelectric actuator or mechanism can be fabricated by providing polarizing electrodes to either side of a thin film sheet, and applying an electric field between these electrodes to polarize the thin film sheet at least substantially perpendicular to the sheet's surface. The top-most polarizing electrode is removed, and pairs of interdigitated electrodes are formed embedded within the sheet. The remaining polarizing electrode is then at least partially removed.

FIG. 1 shows an example cross-sectional side view of a piezoelectric fluid-ejection assembly 100 of a unimorph type. The assembly 100 includes a rigid orifice plate 102 having an outlet 104 through which droplets of fluid are ejected. The assembly 100 further includes a flexible diaphragm 106 having an inlet 108 to receive the fluid that is ultimately ejected as droplets through the outlet 104. The assembly 100 also includes a number of rigid sidewalls 110A and 110B, collectively referred to as the sidewalls 110, which separate the orifice plate 102 from the diaphragm 106.

A fluid chamber, or cavity, 112 of the assembly 100 is defined by the orifice plate 102, the diaphragm 106, and the sidewalls 110 to contain the fluid received through the inlet 108 prior to ejection of droplets of the fluid through the outlet 104. A piezoelectric actuator, or mechanism, 114 is disposed along the diaphragm 106 opposite the fluid chamber 112. Inducing an electric field within the actuator 114, at least substantially parallel to the plane of the actuator 114, causes the actuator 114 to physically deform, which results in the diaphragm 106 and the actuator 114 to bend into the chamber 112, which in turn reduces the size of the fluid chamber 112 and thus causes droplets of the fluid to be ejected through the outlet 104. Subsequent removal of the electric field then permits the actuator 114 to relax, which returns the diaphragm 106 and actuator 114 to the unbent state.

An x-axis 116, a y-axis 118, and a z-axis 120 are depicted in FIG. 1. The x-axis 116 is parallel to the length of the piezoelectric actuator 114, from left to right in FIG. 1. The y-axis 118 is parallel to the width of the actuator 114, into the plane of FIG. 1. The z-axis 120 is parallel to the height of the actuator 114, from bottom to top in FIG. 1. Physical deformation of the actuator 114 responsive to inducing an electric field within the actuator 114 at least substantially parallel to the plane of the actuator 114 can cause the actuator 114 to undergo shear strain along the y-axis 118 and along the z-axis 120. The piezoelectric actuator 114 is also referred to as a thin film sheet of piezoelectric material.

FIGS. 2A, 2B, and 2C show example bottom views of the piezoelectric fluid-ejection assembly 100. The flexible diaphragm 106 and the piezoelectric actuator 114 are particularly depicted, but not the inlet 108, in FIGS. 2A, 2B, and 2C. The actuator 114 includes a pair of interdigitated electrodes 202A and 202B, which are collectively referred to as the electrodes 202. The electrodes 202 are embedded within the actuator 114. Application of a voltage between the electrodes 202 induces an electric field in the regions 215 within the actuator 114 at least substantially parallel to the plane of the actuator 114, which causes the actuator 114 to physically deform.

In FIGS. 2A and 2B, the piezoelectric actuator 114 has a length parallel to the x-axis 116 and a width parallel to the y-axis 118. The electrode 202A has a number of fingers 204A extending along the length of the actuator 114, and a bar 206A extending along the width of the actuator 114 that electrically connects the fingers 204A together. Similarly, the electrode 202B has a number of fingers 204B and two bars 206B that electrically connect the fingers 204B together. The fingers 204A and 204B are collectively referred to as the fingers 204, and the bars 206A and 206B are collectively referred to as the bars 206. It is noted that the width of the regions 215 along the y-axis 118 between the fingers 204A and 204B is desirably constant, to avoid undue stress within the actuator 114.

The bars 206 of the electrodes 202 are disposed at opposite sides of the actuator 114. The fingers 204B of the electrode 202B are interleaved in relation to the fingers 204A of the electrode 202A, and vice-versa. In this sense, the electrode 202B is said to be interdigitated in relation to the electrode 202A, and vice-versa. The fingers 202 can be equally spaced in relation to one another, to achieve identical electrical field distributions in the regions between the fingers 202, ensuring uniform deformation of the actuator 114. The difference between FIGS. 2A and 2B is the presence of an additional electrode tail 207 of the electrode 202A in FIG. 2B. The electrode tail 207 wraps around the right most bar 206B of the electrode 202B.

In FIGS. 2A and 2B, the plane defined by the x-axis 116 and the y-axis 118 is parallel to the surface of the diaphragm 106. The material in-between the fingers 204 of the electrodes 202 occupies more of this plane than the fingers 204 of the electrodes 202 do. In one example, the ratio of the width of the thin film sheet (i.e., the piezoelectric actuator 114) to the width of the fingers 204 of the electrodes 202 within the plane is ten-to-one. The material in-between the fingers 204 is a thin film sheet (i.e., the piezoelectric actuator 114) it is noted that the fingers 204 of the electrodes 202 are within the piezoelectric actuator 114.

In FIG. 2C, the electrodes 202 are concentrically circular in shape. The actuator 114 and the flexible diaphragm 106 are likewise circular in shape. The electrodes 202, the actuator 114, and the flexible diaphragm 106 can instead be oval in shape, and so on, rather than being circular as depicted in FIG. 2C.

Also depicted in FIGS. 2A, 2B, and 2C are contact pads 208A and 208B, collectively referred to as the contact pads 208, and conductive traces 210A and 210B, collectively referred to as the conductive traces 210. The conductive trace 210A electrically connects the contact pad 208A to the electrode 202A, whereas the conductive trace 210B electrically connects the contact pad 208B to the electrode 202B. A voltage source 212 is electrically connected to the contact pads 208 to provide a voltage to the electrodes 202, and thus to induce an electric field in one or more regions 215 within the piezoelectric actuator 114. While the contact pads 208 are depicted as being located on opposite sides in FIGS. 2A, 2B, and 2C, they can instead be located on the same side.

Figure 3B:
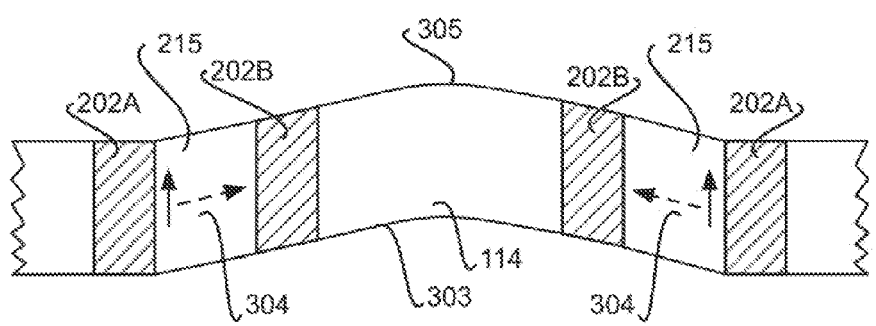

FIGS. 3A and 3B show an example cross-sectional front view of the piezoelectric actuator 114, in a relaxed state and in an excited state, respectively. The piezoelectric actuator 114 has a bottom surface 303 and a top surface 305. The material of the piezoelectric actuator 114 is polarized at least substantially perpendicular to the surfaces 303 and 305, as depicted by solid arrows 301 in FIG. 3A. In FIG. 3A, the solid arrows 301 point from the bottom surface 303 to the top surface 305, but alternatively the material of the piezoelectric actuator 114 can be polarized from the top surface 305 to the bottom surface 303.

In the relaxed state of the piezoelectric actuator 114 in FIG. 3A, no voltage is being applied across the electrodes 202. As such, no electric field is induced in the regions 215 between the electrodes 202 within the piezoelectric actuator 114. Therefore, the piezoelectric actuator 114 is not physically deformed in FIG. 3A. By comparison, in the excited state of the piezoelectric actuator 114 in FIG. 3B, a voltage is applied across the electrodes 202. The resulting electric field induced in the regions 215 within the piezoelectric actuator 114 at least substantially parallel to the plane of the piezoelectric actuator 114 causes the actuator 114 to physically deform in shear mode. This electric field is indicated by dashed arrows 304 in FIG. 3B.

More specifically, the top portion of the left region 215 shears in one direction at least substantially parallel to the surfaces 303 and 305, and the bottom portion of the left region 215 shears in at least substantially the opposite direction at least substantially parallel to the surfaces 303 and 305. The top portion of the right region 215 also shears in one direction at least substantially parallel to the surfaces 303 and 305, and the bottom portion of the right region 215 shears in at least substantially the opposite direction, at least substantially parallel to the surfaces 303 and 305. However, the top portion of the left region 215 shears in at least substantially the opposite direction that the top portion of the right region 215 does, and the bottom portion of the left region 215 shears in at least substantially the opposite direction that the bottom portion of the right region 215. Shear strain also occurs in the regions 215 between the electrodes in the z direction at least substantially parallel to the faces of the electrodes 202A and 202B. Both the y-axis and the z-axis shearing motions of the material in the regions 215 combine to cause the actuator 114 to physically deform upwards, as depicted in FIG. 3B.

Figure 4A:
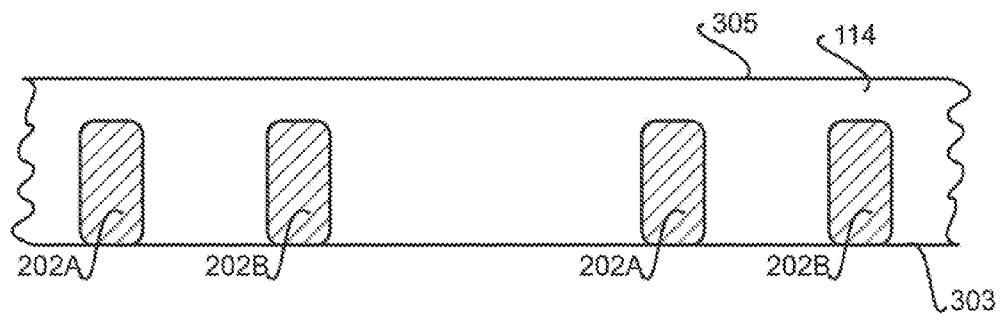
FIGS. 4A, 4B, and 4C are cross-sectional front view diagrams of example piezoelectric actuators having different configurations of interdigitated electrodes embedded within the actuators.
Figure 4B:
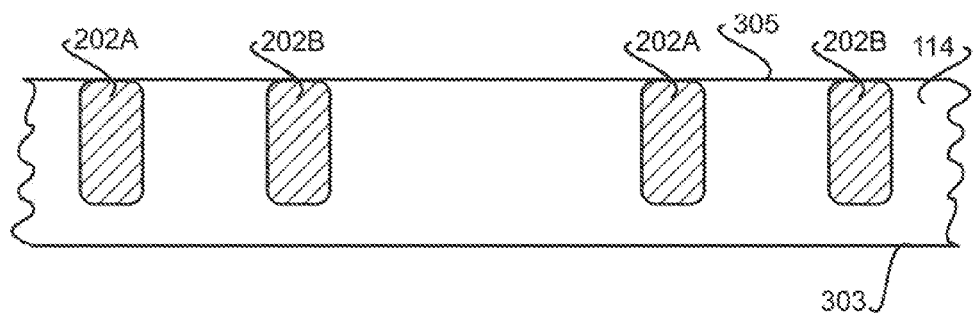
Figure 4C:
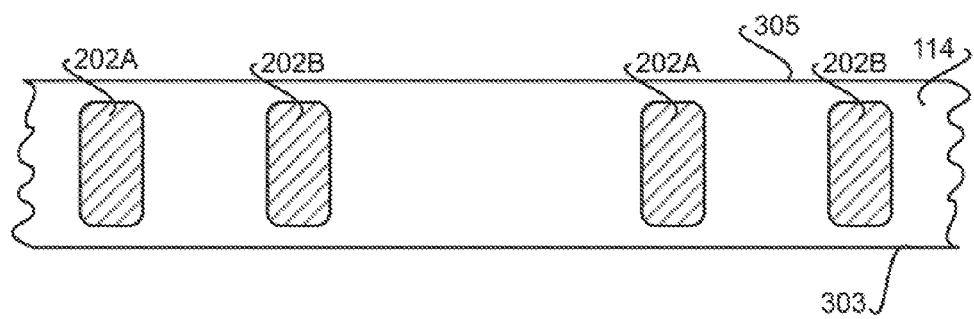

In FIGS. 3A and 3B, the electrodes 202 are depicted as extending completely through the piezoelectric actuator 114. That is, the electrodes 202 start at one surface 303 or 305, and end at the other surfaces 305 or 303. By comparison, FIGS. 4A, 4B, and 4C show different configurations of the electrodes 202. In FIG. 4A, the electrodes 202 start at the surface 303, and extend to but do not reach (i.e., end at) the surface 305. In FIG. 4B, the electrodes 202 start at the surface 305, and extend to but do not reach (i.e., end at) the surface 303. In FIG. 4C, the electrodes are located between the surfaces 303 and 305, but do not extend to, start at, or end at either surface 303 or 305.

Figure 5B:
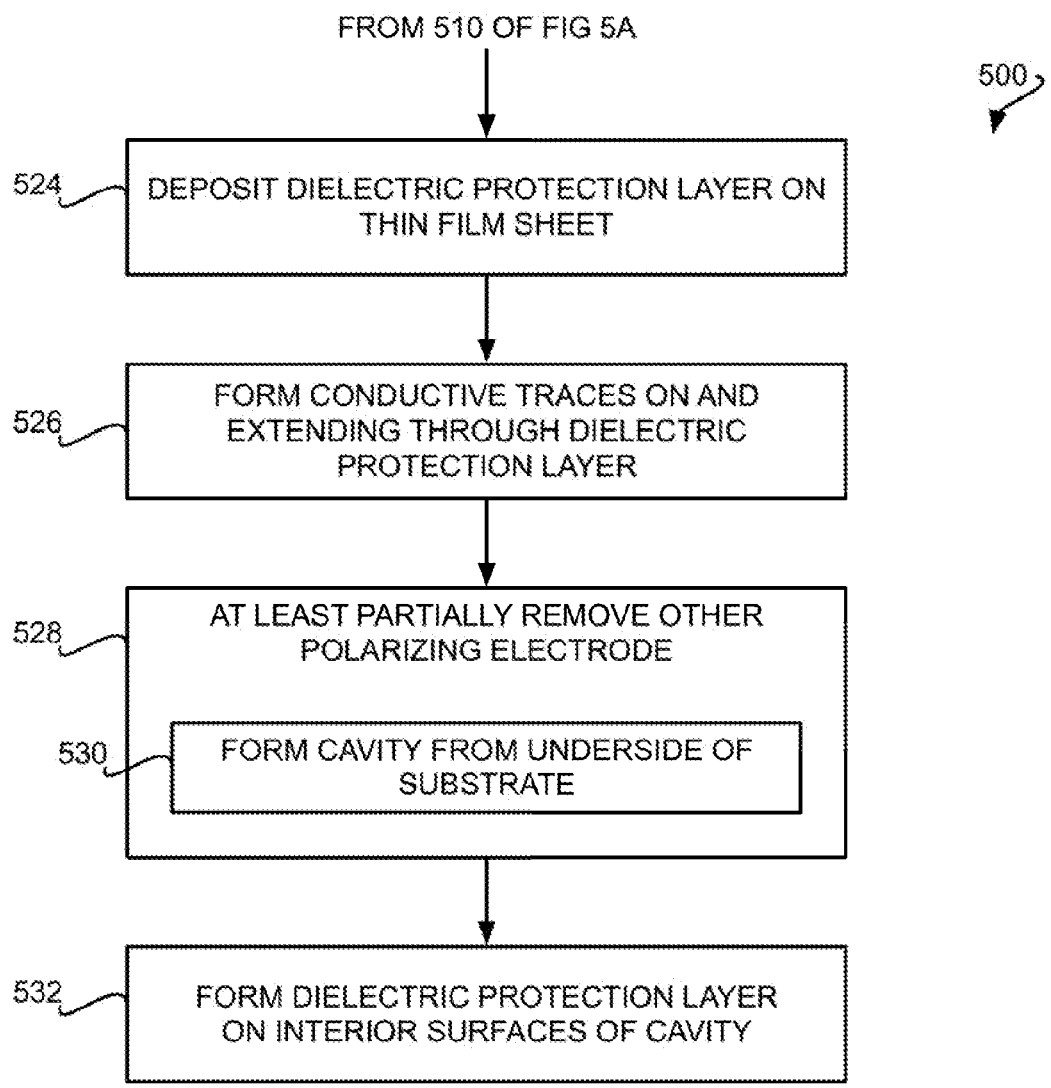

FIGS. 5A and 5B show an example method 500 for fabricating the piezoelectric actuator 114 of the piezoelectric fluid-ejection assembly 100. Referring first to FIG. 5A, polarizing electrodes, a diffusion barrier, and a thin film sheet are provided on a substrate (502), where the thin film sheet is the piezoelectric actuator. The materials may be selected for inertness and stability during high temperature treatment, such as greater than 500 degrees Celsius (° C.) to as high as about 800° C. The thin film sheet can be a thin piezoceramic film sheet.

The substrate is located at the bottom, may be a silicon substrate, or a substrate of another material. The next layer is the diffusion barrier, which may be silicon oxide, another type of thermal oxide, or another type of diffusion barrier material, and which may be 500 nanometers thick. On top of the diffusion barrier is a first polarizing electrode. The first polarizing electrode may be sputtered platinum, a combination of platinum and titanium, or another conductive material, and may be 20-200 nanometers (nm) thick, such as between 100 and 200 nm thick. The first polarizing electrode may further act as a seed layer for positioning the first atoms of the thin film sheet. However, an additional layer, such as lead titanate, may also be deposited onto the first polarizing electrode, such that this additional layer serves as the seed layer.

As such, the thin film sheet is on top of the first polarizing electrode. The thin film sheet may be a piezoceramic crystal, another type of piezoceramic material, or another type of piezoelectric material. The material of the thin film sheet may be deposited in multiple layers, by using a sol gel process, in a single layer by radio frequency (RF) magnetron sputtering on a heated substrate, such as between 500-600° C., or by using another process. If a heated substrate is not employed— i.e., if a non-heated substrate is employed, then a thermal treatment may be performed after deposition of the thin film sheet onto the substrate.

The deposited thin film sheet layers may then be annealed at about 700° C. to crystallize the material of the thin film sheet, which can result in formation of vertical columnar crystals of the material of the thin film sheet. The material may spontaneously become partially polarized during this heat treatment, or during the prior high temperature deposition of the thin film sheet layers. It is noted that thicker films will likely have less polarization. Thereafter, on top of the thin film sheet a second polarizing electrode is deposited. The second polarizing electrode may be nickel-chromium, aluminum, platinum, or another conductive material, and can be deposited to a thickness of 100 nm.

Figure 6A:
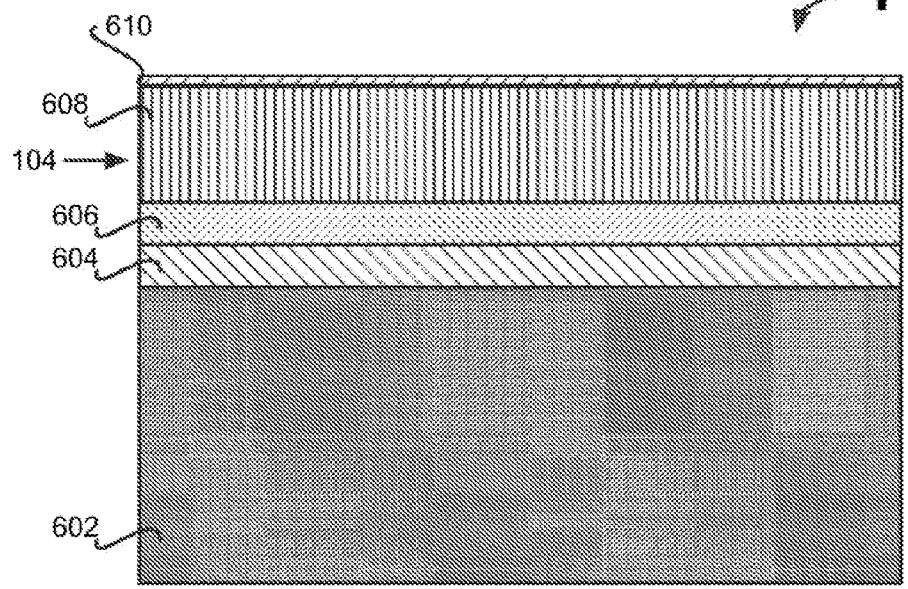
FIGS. 6A, 6B, 6C, 6D, 6E, and 6F are cross-sectional front view diagrams depicting an example piezoelectric fluid-ejection assembly after various parts of the method of FIGS. 5A and 5B have been performed.

FIG. 6A shows an example of the resulting piezoelectric fluid-ejection assembly 100 after part 502 of the method 500 has been performed. On top of a substrate 602 is a diffusion barrier 604, and on top of the diffusion barrier 604 is a first polarizing electrode 606. On top of the first polarizing electrode 606 is a thin film sheet 608 that forms the piezoelectric actuator 114 of the fluid-ejection assembly 100. Finally, on top of the thin film sheet 608 is a second polarizing electrode 610.

Referring back to FIG. 5A, an electric field is applied between the polarizing electrodes to (further) polarize the thin film sheet (504), after which application of the electric field is ceased (506). The thin film sheet may be polarized in this manner at a temperature anywhere from ambient temperature (i.e., room temperature) to an elevated temperature, such as 150° C., if not higher, such as greater than 300° C. The electric field has a magnitude greater than the electric field that will later be induced within the fabricated piezoelectric fluid-ejection assembly 100 to cause the piezoelectric actuator 114 to physically deform. For instance, the electric field applied in part 504 may be two-to-five times greater than the electric field that will later be induced within the fabricated fluid-ejection assembly 100 to cause the actuator 114 to physically deform. The electric field may be between five and ten coercive fields (Ec) in measure.

Figure 6B:
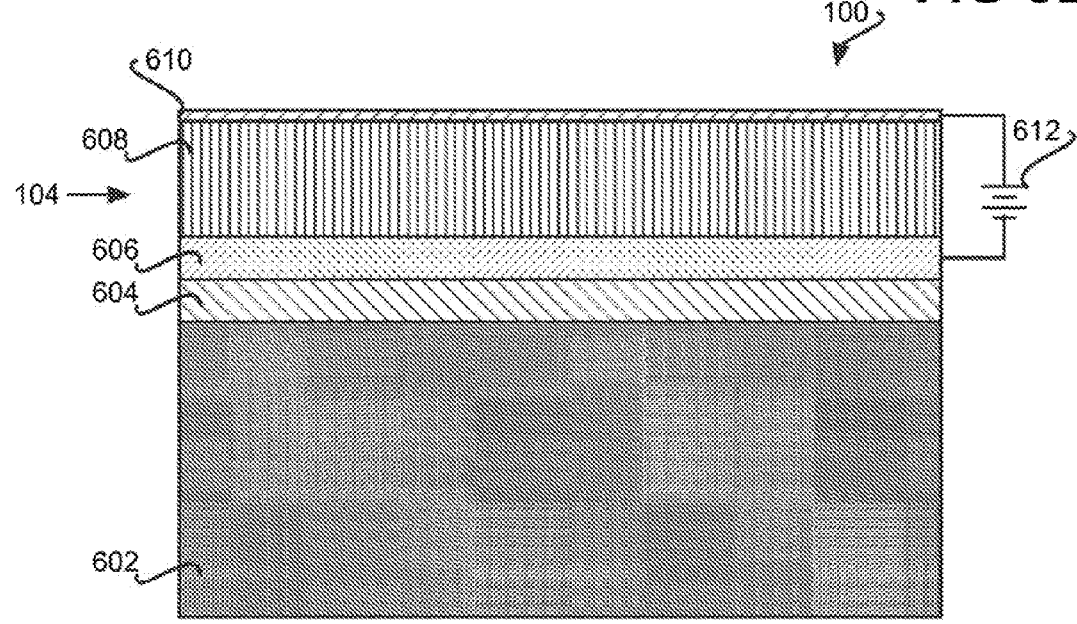

FIG. 6B shows an example of the resulting piezoelectric fluid-ejection assembly 100 after part 504 of the method 500 has been performed. The fluid-ejection assembly 100 includes in FIG. 6B the substrate 602, the diffusion barrier 604, the first polarizing electrode 606, the thin film sheet 608 of the piezoelectric actuator 114, and the second polarizing electrode 610, as in FIG. 6A. A voltage source 612 is electrically connected to the polarizing electrodes 606 and 610, causing the thin film sheet 608 to become polarized. Once the voltage source 612 is removed from the polarizing electrodes 606 and 610, however, the thin film sheet 608 remains polarized.

It is noted that polarization is a summation of the electric fields of internal dipoles formed between atoms in a crystal. The dipoles cluster into domains, and point in varying directions, but the overall effect of polarization is that the dipoles are at least partially aligned, to provide for a net polarization. Components of polarization fields of the dipoles that are not at least substantially parallel to the overall polarization field tend to cancel one another.

Referring back to FIG. 5A, the second polarizing electrode is removed (508), such as by etching. Interdigitated electrodes embedded within the thin film sheet are then formed (510). This can be achieved as follows. Trenches may be formed within the thin film sheet (512). For instance, a photoresist layer may be deposited on the thin film sheet and patterned in correspondence with the locations of the trenches (514), which themselves correspond to the locations of the interdigitated electrodes. The thin film sheet may then be etched where the thin film sheet is exposed through the photoresist layer (516). This etching may be dry etching. The ratio of the amount of the thin film sheet that remains after etching to the amount of the thin film sheet that has been removed may be at least 3:1 to ensure that there is a sufficient a amount of the thin film sheet within the piezoelectric actuator 114.

Figure 6C:
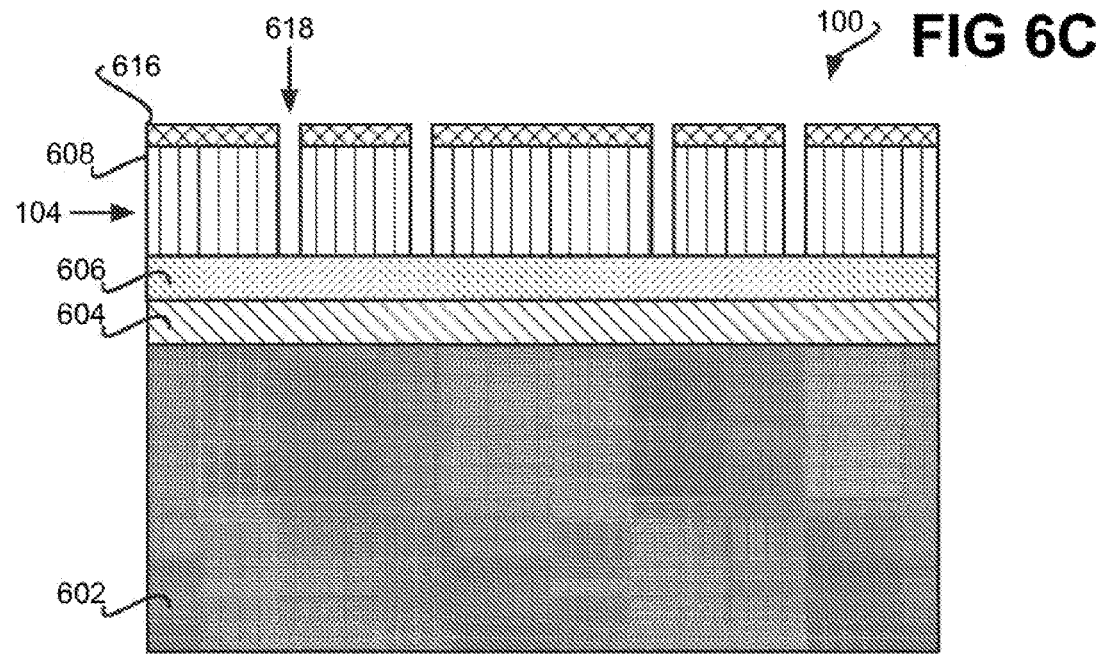

FIG. 6C shows an example of the resulting piezoelectric fluid-ejection assembly 100 after parts 514 and 516 of the method 500 have been performed. The fluid-ejection assembly 100 includes in FIG. 6C the substrate 602, the diffusion barrier 604, the first polarizing electrode 606, and the thin film sheet 608 of the piezoelectric actuator 114, but not the second polarizing electrode 610, which was removed in part 508. A photoresist layer 616 has been deposited on the thin film sheet 608 and patterned. The thin film sheet 608 is etched where the sheet 608 is exposed through the photoresist layer 616 to form trenches 618 within the thin film sheet 608.

Referring back to FIG. 5A, the interdigitated electrodes embedded within the thin film sheet may continue to be formed by coating the trenches and the photoresist layer with a conductive film (518), and removing the photoresist layer, including the conductive layer on the photoresist layer (520). The trenches can then be at least partially filled with conductive material to form the interdigitated electrodes embedded within the thin film sheet (522). The conductive film coating the trenches may be nickel, another type of metal film, or another type of conductive film. The conductive film serves as a seed layer if the trenches are filled with conductive material via electrochemical deposition, or as an adhesion layer if another form of deposition is employed to fill the trenches with conductive material. Alternatively still, the conductive film may not be applied.

Therefore, the trenches can be filled with conductive material by electrochemical deposition, such as electroplating, where the conductive film and the conductive material are the same material, such that the conductive film serves as a seed layer for this deposition process, as noted above. The trenches can also be filled by sputtering the conductive material within the trenches, and subsequently performing chemical-mechanical planarization (CMP) to remove the conductive material from the top of the thin film sheet. Where the trenches are filled by sputtering, the conductive material sputtered may or may not be same material as the conductive film, and the conductive film may be absent. The trenches can be filled using other deposition techniques as well, such as electrodes deposition techniques, in which case the trenches and the photoresist layer do not have to be coated with a conductive film in part 518.

Figure 6D:
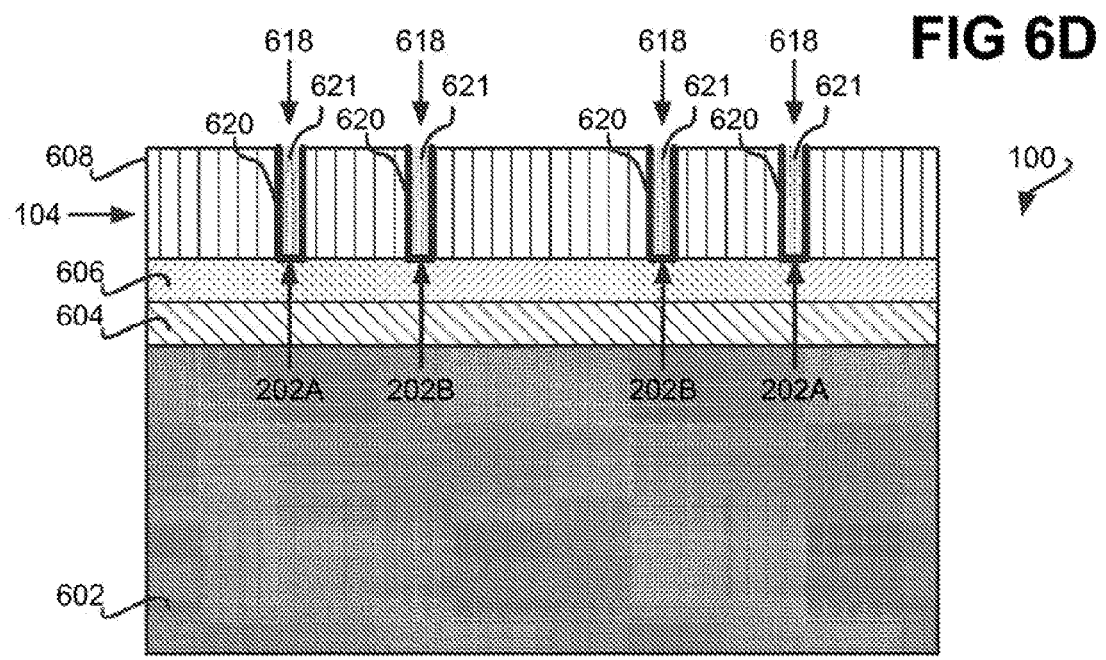

FIG. 6D shows an example of the resulting piezoelectric fluid-ejection assembly 100 after parts 518, 520, and 522 of the method 500 have been performed. The fluid-ejection assembly 100 includes in FIG. 6D the substrate 602, the diffusion barrier 604, the first polarizing electrode 606, the thin film sheet 608 of the piezoelectric actuator 114, but not the photoresist layer 616, which was removed in part 520. The conductive film 620 coats the sidewalls and bottoms of the trenches 618. The conductive material 621 has been deposited within the trenches 618, forming the interdigitated electrodes 202 embedded within the thin film sheet 608, and which are a part of the piezoelectric actuator 114.

Referring now to FIG. 5B, a dielectric protection layer may be deposited on the thin film sheet (524), and conductive traces formed on and extending through the dielectric protection layer to contact the electrodes (526). The dielectric protection layer may be 20-40 nm thick, and even up to 100 nm thick in some implementations, and may be aluminum oxide, or another type of dielectric protection later. The dielectric protection layer forms a seal to protect the thin film sheet from water vapor. The conductive traces are formed so that a voltage source can be electrically connected to the interdigitated electrodes.

Figure 6E:
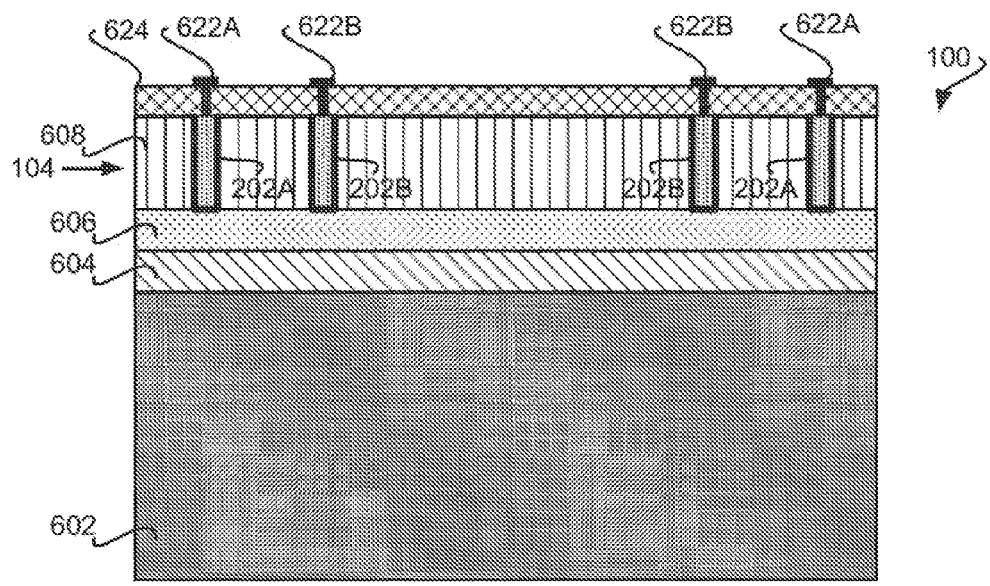

FIG. 6E shows an example of the resulting piezoelectric fluid-ejection assembly 100 after parts 524 and 526 of the method 500 have been performed. The fluid-ejection assembly 100 includes in FIG. 6E the substrate 602, the diffusion barrier 604, the first polarizing electrode 606, and the thin film sheet 608 and the electrodes 202 of the piezoelectric actuator 114. A dielectric protection layer 624 has been formed on the thin film sheet 608 and the electrodes 202 of the piezoelectric actuator 114.

Conductive traces 622A and conductive traces 622B, collectively referred to as the conductive traces 622, have been formed on and extending through the dielectric protection layer 624. The conductive traces 622A make contact with one another and with the electrodes 202A, and the conductive traces 622B make contact with one another and with the electrodes 202B, which is just partially depicted in FIG. 6E due to the cross-sectional front view perspective of FIG. 6E. It is noted that in some implementations, at least one of the electrodes 202 can extend into the dielectric protection layer 624 itself. It is further noted that in FIG. 6E (as well as in FIG. 6F), the thickness of the electrodes 202 is exaggerated from illustrative clarity. Furthermore, in other implementations, the conductive traces 622 may be disposed under the dielectric protection layer 624 instead of above the layer 624, in which case the traces 622 do not have to extend through the layer 624.

Referring back to FIG. 5B, the second polarizing electrode is at least partially removed (528). For instance, insofar as a piezoelectric fluid-ejection assembly 100 is being formed via the method 500, the cavity 112 of the assembly 100 may be formed from the underside of the substrate (530), which results in removal of the second polarizing electrode. The cavity 112 may be formed via etching. Thereafter, another dielectric protection layer (i.e., different from the dielectric protection layer applied in part 524) can be applied to the interior surfaces of the cavity 112 (532), such as tantalum pentoxide, hafnium oxide, or another stable and impermeable or otherwise chemically inert dielectric, to protect the piezoelectric actuator 114 from the fluid to be contained within the cavity 112.

Figure 6F:
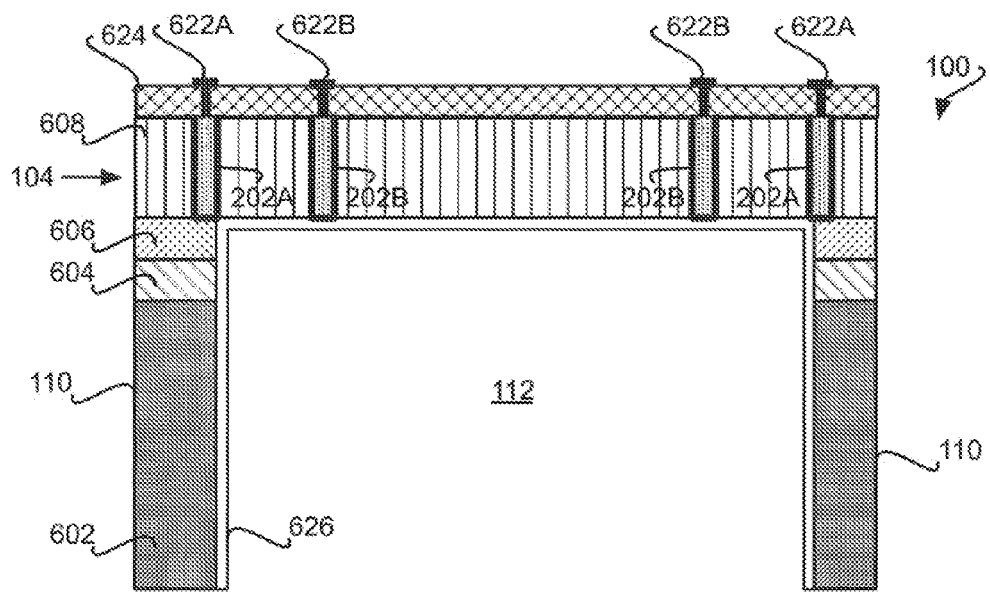

FIG. 6F shows an example of the resulting piezoelectric fluid-ejection assembly 100 after parts 528, 530, and 532 of the method 500 have been performed. The fluid-ejection assembly 100 includes in FIG. 6F the substrate 602, the diffusion barrier 604, the first polarizing electrode 606, the thin film sheet 608 and the electrodes 202 of the piezoelectric actuator 114, the dielectric protection layer 624, and the conductive traces 622. The cavity 112 has been formed from the underside of the substrate 602, and a dielectric protection layer 626 applied to the interior surfaces of the cavity 112.

The fluid-ejection assembly 100 as depicted in FIG. 6F contrasts with the fluid-ejection assembly 100 as depicted in FIG. 1 as follows. The substrate 602 in FIG. 6F forms the sidewalls 110 of the fluid-ejection assembly 100. Unlike the depiction of the fluid-ejection assembly 100 in FIG. 1, however, the depiction of the assembly 100 in FIG. 6F does not include a diaphragm 106, although the assembly 100 of FIG. 6F can include a diaphragm 106. To complete the fluid-ejection assembly 100 of FIG. 6F, an orifice plate 102 having an outlet 104 can be formed at the opening of the cavity 112, and an inlet 108 formed at the top of the cavity 112 in FIG. 6F.

Figure 7:
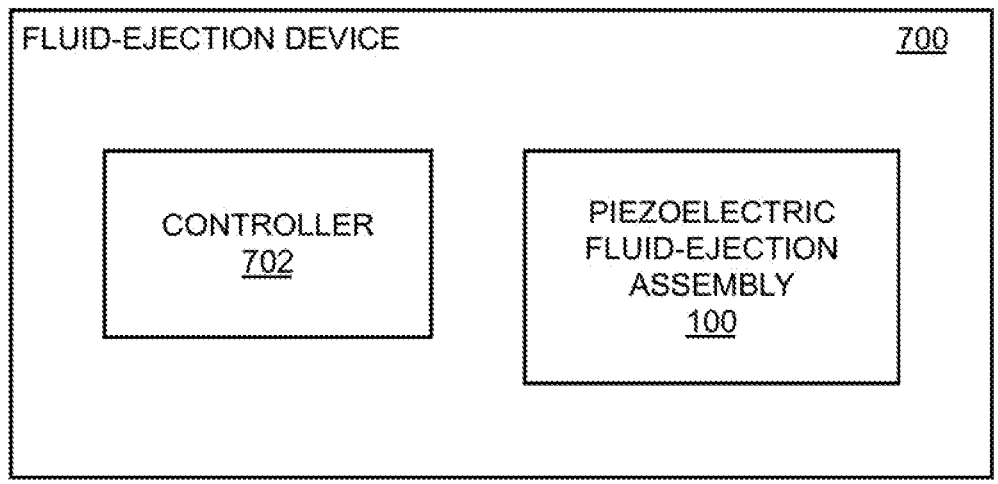
FIG. 7 is a block diagram of an example representative fluid-ejection device.

FIG. 7 shows a block diagram of a rudimentary example fluid-ejection device 700. The fluid-ejection device 700 includes a controller 702 and the piezoelectric fluid-ejection assembly 100. The controller 702 may be implemented in hardware, or a combination of machine-readable instructions and hardware, and controls ejection of droplets of fluid from the device 700 in a desired manner by the fluid-ejection assembly 100.

It is noted that the fluid-ejection device 700 may be an inkjet-printing device, which is a device, such as a printer, that ejects ink onto media, such as paper, to form images, which can include text, on the media. The fluid-ejection device 700 is more generally a fluid-ejection, precision-dispensing device that precisely dispenses fluid, such as ink, melted wax, or polymers. The fluid-ejection device 700 may eject pigment-based ink, dye-based ink, another type of ink, or another type of fluid. Examples of other types of fluid include those having water-based or aqueous solvents, as well as those having non-water-based or non-aqueous solvents. However, any type of fluid-ejection, precision-dispensing device that dispenses a substantially liquid fluid may be used.

A fluid-ejection precision-dispensing device is therefore a drop-on-demand device in which printing, or dispensing, of the substantially liquid fluid in question is achieved by precisely printing or dispensing in accurately specified locations, with or without making a particular image on that which is being printed or dispensed on. The fluid-ejection precision-dispensing device precisely prints or dispenses a substantially liquid fluid in that the latter is not substantially or primarily composed of gases such as air. Examples of such substantially liquid fluids include inks in the case of inkjet-printing devices. Other examples of substantially liquid fluids thus include drugs, cellular products, organisms, fuel, and so on, which are not substantially or primarily composed of gases such as air and other types of gases, as can be appreciated by those of ordinary skill within the art.

It is finally noted that while examples have been substantially described in relation to a piezoelectric actuator that is part of a piezoelectric fluid-ejection assembly of a fluid-ejection device, the piezoelectric actuator does not have to be part of a piezoelectric fluid-ejection assembly of a fluid ejection-device. For instance, the piezoelectric actuator that has been described may be part of a piezoelectric fluid-ejection assembly that is not part of a fluid-ejection device. Furthermore, the piezoelectric actuator that has been described may not even be part of a piezoelectric fluid-ejection assembly or part of a fluid-ejection device. Most generally, the piezoelectric actuator may be referred to as a piezoelectric mechanism, such as a piezoelectric bender, which physically deforms responsive to an electric field induced therein via application of a voltage over the electrodes embedded within the actuator. As such, a piezoelectric actuator as described herein is one type of piezoelectric mechanism. The piezoelectric mechanism can further include or be part of a sensor.

We claim:

1. A piezoelectric mechanism comprising:
   first and second electrodes, the second electrode interdigitated in relation to the first electrode; and,
   a thin film sheet of piezoelectric material within which the first and the second electrodes are embedded, the thin film sheet polarized in a direction at least substantially perpendicular to a surface of the thin film sheet,
   wherein the thin film sheet is to physically deform in a shear mode, responsive to an electric field induced within the thin film sheet at least substantially parallel to the thin film sheet via application of a voltage across the first and the second electrodes,
   wherein the surface of the thin film sheet is a first surface of the thin film sheet at least substantially parallel to and opposite a second surface of the thin film sheet,
   and wherein the first and second electrodes start at the first surface and extend to and end at the second surface.

2. The piezoelectric mechanism of claim 1, wherein the surface of the thin film sheet is a first surface of the thin film sheet at least substantially parallel to and opposite a second surface of the thin film sheet,
   and wherein the first and the second electrodes are located between but do not extend to, start at, or end at the first and second surfaces.

3. The piezoelectric mechanism of claim 1, wherein the piezoelectric material is a piezoceramic material.

4. A piezoelectric fluid-ejection assembly comprising:
   an orifice plate having an outlet through which droplets of fluid are ejected;
   a plurality of sidewalls defining an inlet to receive the fluid;
   a fluid chamber defined by at least the orifice plate and the sidewalls to contain the fluid received through the inlet prior to ejection of the droplets of the fluid through the outlet; and,
   a piezoelectric actuator disposed opposite the orifice plate and comprising:
     first and second electrodes, the second electrode interdigitated in relation to the first electrode; and,
     a thin film sheet of piezoelectric material within which the first and the second electrodes are embedded, the thin film sheet polarized in a direction at least substantially perpendicular to a surface of the thin film sheet,
   wherein the thin film sheet is to physically deform in a shear mode, responsive to an electric field induced within the thin film sheet at least substantially parallel to the thin film sheet via application of a voltage across the first and the second electrodes,
   wherein physical deformation of the thin film sheet causes a temporary reduction in a size of the fluid chamber to cause the fluid to be ejected through the outlet,
   wherein the surface of the thin film sheet is a first surface of the thin film sheet at least substantially parallel to and opposite a second surface of the thin film sheet,
   and wherein the first and second electrodes start at the first surface and extend to and end at the second surface.

5. A method for fabricating a piezoelectric mechanism comprising:
   providing a first polarizing electrode, a thin film sheet of piezoelectric material, and a second polarizing electrode on a substrate;
   applying an electric field between the first and the second polarizing electrodes to polarize the thin film sheet at least substantially perpendicular to a surface of the thin film sheet;
   removing the first polarizing electrode;
   forming first and second electrodes embedded within the thin film sheet, the second electrode interdigitated in relation to the first electrode; and,
   at least partially removing the second polarizing electrode, by forming a cavity from an underside of the substrate, the cavity extending through the second polarizing electrode and reaching the thin film sheet,
   wherein the surface of the thin film sheet is a first surface of the thin film sheet at least substantially parallel to and opposite a second surface of the thin film sheet,
   and wherein the first and second electrodes start at the first surface and extend to and end at the second surface.

6. The method of claim 5, wherein forming the first and the second electrodes embedded within the thin film sheet comprises:
   forming trenches within the thin film sheet; and,
   at least partially filling the trenches with a conductive material to form the first and the second electrodes embedded within the thin film sheet.

7. The method of claim 6, wherein forming the first and the second electrodes embedded within the thin film sheet further comprises, prior to at least partially filling the trenches with the conductive material:
   coating the trenches with a conductive film,
   wherein at least partially filling the trenches with a conductive material comprises employing electroplating, where the conductive film acts as a seed later for the electroplating.

8. The method of claim 7, wherein forming the trenches within the thin film sheet comprises:
   patterning a photoresist layer on the thin film sheet, the photoresist layer having a pattern corresponding to the trenches; and,
   etching the thin film sheet where the thin film sheet is exposed within the photoresist layer, to form the trenches.

9. The method of claim 8, wherein coating the trenches with a conductive film also results in coating the photoresist layer with the conductive film,
   and wherein forming the first and the second electrodes embedded within the thin film sheet further comprises, prior to at least partially filling the trenches with the conductive material:
   removing the conductive film on the photoresist layer and removing the photoresist layer.

10. The method of claim 5, further comprising:
    providing a diffusion barrier between the first polarizing electrode and the substrate;
    ceasing application of the electric field after the thin film sheet has been polarized at least substantially perpendicular to a surface of the thin film sheet; and, depositing a dielectric layer on the thin film sheet after the first and the second electrodes have been formed embedded within the thin film sheet.

11. The method of claim 10, further comprising:

forming conductive traces on and extending through the dielectric layer so that the conductive traces make contact with the first and the second electrodes.

12. The method of claim 5, wherein the thin film sheet is to physically deform in a shear mode due to polarization of the thin film sheet at least substantially perpendicular to the surface of the thin film sheet, responsive to an electric field induced within the thin flat sheet via application of a voltage across the first and the second electrodes.

\* \* \* \* \*

UNITED STATES PATENT AND TRADEMARK OFFICE
CERTIFICATE OF CORRECTION

PATENT NO. : 9,028,051 B2
APPLICATION NO. : 14/000619
DATED : May 12, 2015
INVENTOR(S) : Tony S. Cruz-Uribe et al.

Page 1 of 1

It is certified that error appears in the above-identified patent and that said Letters Patent is hereby corrected as shown below:

Drawings

In sheet 7 of 12, reference numeral 520, line 1, delete "PHOTO RESIST" and insert -- PHOTORESIST --, therefor.

Claims

In column 11, line 12, in Claim 12, delete "flat" and insert -- film --, therefor.

Signed and Sealed this
Twenty-first Day of June, 2016

Michelle K. Lee
*Director of the United States Patent and Trademark Office*